(12) United States Patent
De Vos et al.

(10) Patent No.: US 7,742,149 B2
(45) Date of Patent: Jun. 22, 2010

(54) STAGE SYSTEM AND LITHOGRAPHIC APPARATUS COMPRISING SUCH A STAGE SYSTEM

(75) Inventors: Youssef Karel Maria De Vos, Lille (BE); Ronald Casper Kunst, Geldrop (NL); Patricia Vreugdewater, Eindhoven (NL); Peter Paul Hempenius, Nuenen (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 12/155,109

(22) Filed: May 29, 2008

(65) Prior Publication Data

US 2008/0309911 A1 Dec. 18, 2008

Related U.S. Application Data

(60) Provisional application No. 60/924,741, filed on May 30, 2007.

(51) Int. Cl.
G03B 27/58 (2006.01)

(52) U.S. Cl. .......................................... 355/72; 355/53
(58) Field of Classification Search ................... 355/53, 355/72, 75, 77, 73
See application file for complete search history.

(56) References Cited

U.S. PATENT DOCUMENTS

2003/0098961 A1* 5/2003 Iwamoto ....................... 355/72
2006/0072098 A1* 4/2006 Dams .......................... 355/72

OTHER PUBLICATIONS

U.S. Appl. No. 11/712,555, filed Mar. 1, 2007, Kamidi et al.

* cited by examiner

*Primary Examiner*—Alan A Mathews
*Assistant Examiner*—Mesfin T Asfaw
(74) *Attorney, Agent, or Firm*—Pillsbury Winthrop Shaw Pittman LLP

(57) ABSTRACT

A stage system for a lithographic apparatus includes a stage, an over-determined number of actuators arranged to act on the stage, and an electric power supply configured to provide a current to the actuators, wherein the current is supplied to a coil associated with a first actuator of the actuators and to a coil associated with a second actuator of the actuators.

5 Claims, 5 Drawing Sheets

STAGE SYSTEM AND LITHOGRAPHIC APPARATUS COMPRISING SUCH A STAGE SYSTEM

CROSS REFERENCE TO RELATED APPLICATIONS

This application claims priority to provisional patent application Ser. No. 60/924,741 filed May 30, 2007, the content of which is incorporated herein in its entirety by reference.

FIELD

The present invention relates to a stage system and a lithographic apparatus including such a stage system.

BACKGROUND

A lithographic apparatus is a machine that applies a desired pattern onto a substrate, usually onto a target portion of the substrate. A lithographic apparatus can be used, for example, in the manufacture of integrated circuits (ICs). In such a case, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Conventional lithographic apparatus include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

Increasing demands on throughput of the lithographic apparatus, e.g. on an amount of substrates to be processed by the lithographic apparatus in a certain time period, require increasing speeds and accelerations of stages such as a substrate table or a patterning device (e.g., mask) table. Furthermore, demands on resolution and accuracy of the pattern to be projected by the lithographic apparatus onto the substrate increase, which translates into a tendency to increase a size of the patterning device, in combination with an increased demagnification factor of the projection optics, to be able to provide the required level of detail on the substrate. On the one hand, requirements as to a high scanning speed lead to keeping a weight of a stage as low as possible, while on the other hand, the stage should be constructed such as to obtain a high stiffness, to avoid occurrence or excitation of resonance modes of the stage, such high stiffness tending to result in massive stage construction. Even further, to be able to achieve a high internal stiffness, use is made of materials having a high stiffness, which unfortunately have a small relative damping, resulting in long settling times for internal vibrations.

SUMMARY

Inspecting some of the design criteria more in detail, servo disturbance rejection and tracking performance (settling behavior) may be improved by increasing the bandwidth of a closed loop control system by means of a feedback controller. Internal structural resonances of the stage, which are always present, impose severe constraints on the extent to which the closed-loop bandwidth can be increased. For this reason, considerable effort is put by control engineers during design of the stage into optimizing mechanics in such a way that these resonance frequencies are as high as possible, allowing a high bandwidth. Generally, based on specifications of the process, a required minimal bandwidth is selected. The mechanical design is then optimized, providing all resonances above this bandwidth. In general, this may imply stiff coupling between actuator and sensor positions, which may result in a relatively heavy construction. In order to design stiff constructions, high E-module materials are used, which are intrinsically badly damped.

In order to improve the dynamic performance of the stage, it may be preferred to apply a so-called over-actuated stage. Such a stage is over-determined in at least one degree of freedom. This is to be understood as providing more actuators than would strictly be necessary for actuation in such a degree of freedom if the stage were a rigid body. As an example, one actuator (or one actuator at each side) would suffice to actuate a stage to provide for a translation in a direction. By providing more actuators acting in such direction, effects provided in case of resonances, torsion modes, etc. of the stage can be counteracted by a suitable driving of these actuators. Over-actuation may be defined as a providing and/or driving of more actuators (and possibly sensors) than would be needed in controlling the motion of a "rigid-body". An over-actuated stage may thus be provided with an over-determined number of actuators, i.e. a larger number of actuators than the number of degrees of freedom in which the stage would be actuated in the "rigid-body" motion controlling approach.

The control of such an over-actuated stage may prove to be difficult when taking into account that a deformation of the stage should be kept to a minimum or desirably be avoided.

Accordingly, it would be advantageous, for example, to enhance the performance of an over-actuated stage.

According to an embodiment of the invention, there is provided a stage system for a lithographic apparatus comprising a stage; a plurality of electromagnetic actuators, the actuators arranged to act on the stage and being over-determined in an actuator degree of freedom; and an electric power supply configured to provide a current to the actuators, wherein the current is supplied to a coil associated with a first actuator of the plurality of actuators and to a coil associated with a second actuator of the plurality of actuators.

In another embodiment of the invention, there is provided A lithographic apparatus, comprising: an illumination system configured to condition a radiation beam; a patterning device support constructed to support a patterning device, the patterning device configured to impart the radiation beam with a pattern in its cross-section to form a patterned radiation beam; a substrate support constructed to hold a substrate; and a projection system configured to project the patterned radiation beam onto a target portion of the substrate; wherein at least one of the supports is supported by a stage system comprising: a stage, a plurality of electromagnetic actuators, the actuators arranged to act on the stage and being over-determined in an actuator degree of freedom, and an electric power supply configured to provide a current to the actuators, wherein the current is supplied to a coil associated with a first actuator of the plurality of actuators and to a coil associated with a second actuator of the plurality of actuators.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
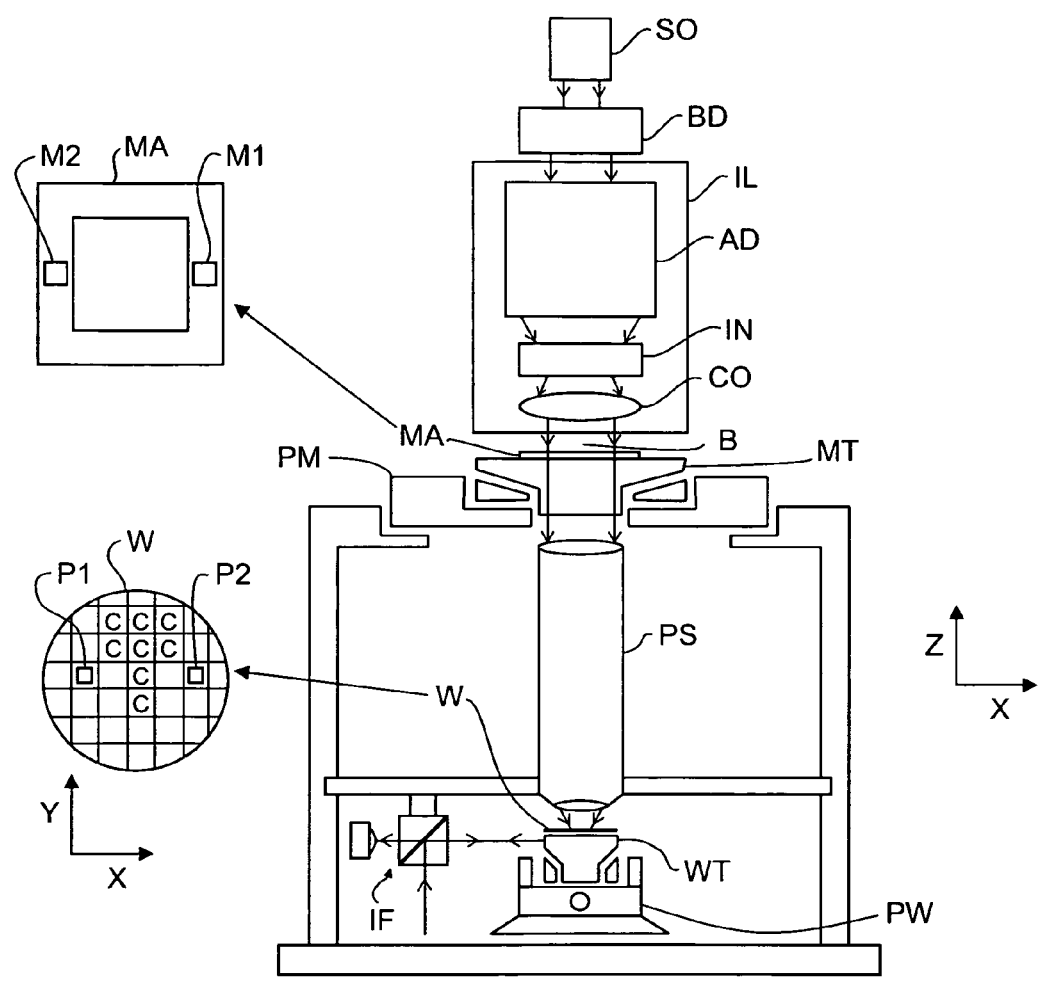
FIG. 1 schematically depicts a lithographic apparatus according to an embodiment of the invention.

FIG. 1 schematically depicts a lithographic apparatus according to one embodiment of the invention. The apparatus includes an illumination system (illuminator) IL configured to condition a radiation beam B (e.g. UV radiation or any other suitable radiation), a patterning device support (e.g. a mask table) MT constructed to support a patterning device (e.g. a mask) MA and connected to a first positioning device PM configured to accurately position the patterning device in accordance with certain parameters. The apparatus also includes a substrate support (e.g. a wafer table) WT constructed to hold a substrate (e.g. a resist-coated wafer) W and connected to a second positioning device PW configured to accurately position the substrate in accordance with certain parameters. The apparatus further includes a projection system (e.g. a refractive projection lens system) PS configured to project a pattern imparted to the radiation beam B by patterning device MA onto a target portion C (e.g. including one or more dies) of the substrate W.

The illumination system may include various types of optical components, such as refractive, reflective, magnetic, electromagnetic, electrostatic or other types of optical components, or any combination thereof, for directing, shaping, or controlling radiation.

The patterning device support holds the patterning device in a manner that depends on the orientation of the patterning device, the design of the lithographic apparatus, and other conditions, such as for example whether or not the patterning device is held in a vacuum environment. The patterning device support MT can use mechanical, vacuum, electrostatic or other clamping techniques to hold the patterning device. The patterning device support MT may be a frame or a table, for example, which may be fixed or movable as required. The patterning device support MT may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section so as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate supports (and/or two or more patterning device supports). In such "multiple stage" machines, the additional supports may be used in parallel, or preparatory steps may be carried out on one or more supports while one or more other supports are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques can be used to increase the numerical aperture of projection systems. The term "immersion" as used herein does not mean that a structure, such as a substrate, must be submerged in liquid, but rather only means that a liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross-section.

The radiation beam B is incident on the patterning device (e.g., mask) MA, which is held on the patterning device support MT, and is patterned by the patterning device. Having traversed the patterning device MA, the radiation beam B passes through the projection system PS, which focuses the beam onto a target portion C of the substrate W. With the aid of the second positioning device PW and position sensor IF (e.g. an interferometric device, linear encoder or capacitive sensor), the substrate table WT can be moved accurately, e.g. so as to position different target portions C in the path of the radiation beam B. Similarly, the first positioning device PM and another position sensor (which is not explicitly depicted in FIG. 1) can be used to accurately position the patterning device MA with respect to the path of the radiation beam B, e.g. after mechanical retrieval from a mask library, or during a scan. In general, movement of the patterning device support MT may be realized with the aid of a long-stroke module (coarse positioning) and a short-stroke module (fine positioning), which form part of the first positioning device PM. Similarly, movement of the substrate support WT may be realized using a long-stroke module and a short-stroke module, which form part of the second positioner PW. In the case of a stepper (as opposed to a scanner) the patterning device support MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device MA, the patterning device alignment marks may be located between the dies.

The depicted apparatus could be used in at least one of the following modes:

1. In step mode, the patterning device support MT and the substrate support WT are kept essentially stationary, while an entire pattern imparted to the radiation beam is projected onto a target portion C at one time (i.e. a single static exposure). The substrate support WT is then shifted in the X and/or Y direction so that a different target portion C can be exposed. In step mode, the maximum size of the exposure field limits the size of the target portion C imaged in a single static exposure.

2. In scan mode, the patterning device support MT and the substrate support WT are scanned synchronously while a pattern imparted to the radiation beam is projected onto a target portion C (i.e. a single dynamic exposure). The velocity and direction of the substrate support WT relative to the patterning device support MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the patterning device support MT is kept essentially stationary holding a programmable patterning device, and the substrate support WT is moved or scanned while a pattern imparted to the radiation beam is projected onto a target portion C. In this mode, generally a pulsed radiation source is employed and the programmable patterning device is updated as required after each movement of the substrate support WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
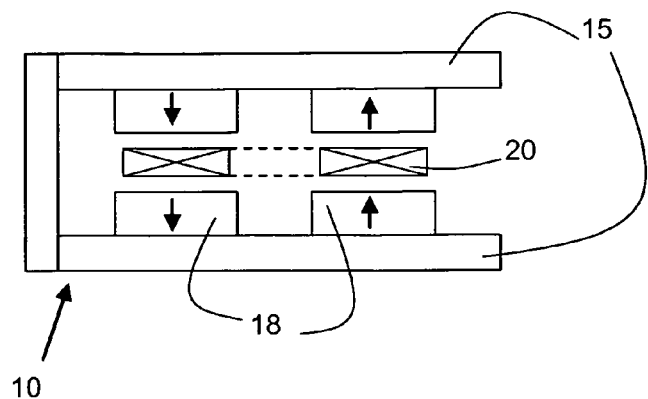
FIG. 2 schematically depicts an actuator as can be used in a stage according to an embodiment of the invention.

FIG. 2 schematically shows an actuator that can be used in a stage according to an embodiment of the invention to position a support or an object table, such as a mask table or a substrate table. The actuator comprises a first part 10 comprising a magnetic yoke 15. Mounted to the yoke are a plurality of permanent magnets 18 arranged to co-operate with a second part of the actuator, the second part comprising a coil 20. In the arrangement as shown, when a current is provided to the coil 20 by an electric power supply, a force is generated in the Y-direction (into and out of the page in FIG. 2) between the first part and the second part. When a plurality of such actuators are mounted to an object table, suitable control of the currents provided to the actuators enables an accurate positioning of the object table in 6 degrees of freedom.

Figure 3A:
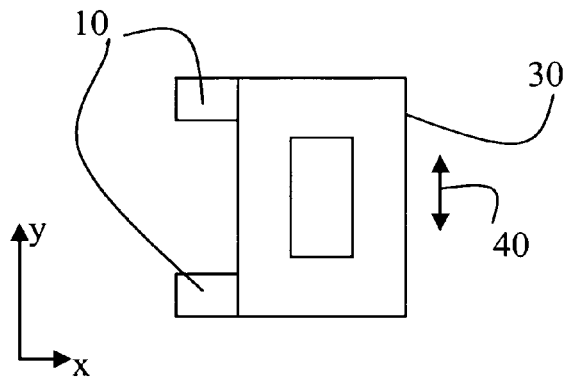
FIG. 3a depicts a schematic view of a first stage according to an embodiment of the invention.

FIG. 3a shows a highly schematic view of a patterning device support (e.g. mask table) 30 to hold a patterning device. In FIG. 3a, a top view is shown, i.e. a plane of drawing of FIG. 3a coincides with a plane of focus or a surface of the patterning device onto which the pattern has been provided. In FIG. 3a, a scanning direction may be in the Y-direction shown. Two actuators are mounted to the patterning device support in such a manner that a force can be generated along the Y-direction 40. Reference number 10 indicates the first parts of the actuators as described with respect to FIG. 2. Note that instead of mounting the first parts of the actuators to the patterning device support, it may also be possible to mount the second parts (i.e. the coils) of the actuators to the patterning device support. FIG. 3a further shows a power supply 30 arranged to provide a current to the coils of both actuators. By connecting the coils of both actuators in series, one ensures that the same current is provided to each coil. Such an arrangement is favorable compared to a situation in which each actuator is supplied from a different power supply. This is advantageous because, as each power supply can be considered to be less than perfect, due to e.g. offset currents, supplying each actuator from a different supply could lead to differences in the generated forces by the different actuators. As a result, the patterning device support could be subject to deformations. By supplying the actuators from the same power supply, differences in the generated force that are caused by imperfections in the power supply can be avoided.

Figure 3B:
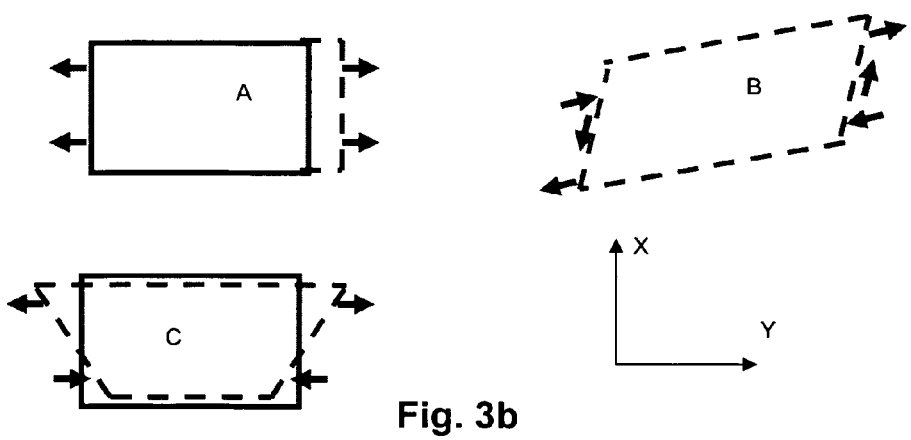
FIG. 3b schematically depicts some possible deformation modes of an object table.

FIG. 3b schematically shows some possible deformations of an object table when different forces act on the object table. The object table as shown is assumed to be equipped with 4 actuators configured to generate forces in the Y-direction (Y-actuators) and two actuators configured to generate forces in the X-direction. Each Y-actuator is assumed to be powered by a separate power supply and is mounted to the object table. Such an object table is desirably made of a material that has a low thermal expansion coefficient, such as zerodur ceramic. Because the object table is located between Y-actuators, the Y-actuators can potentially deform the object table. These deformations potentially give rise to errors in the positioning of an object mounted to the object table. In case the object table is used in a lithographic apparatus to support a patterning device (e.g. a reticle) or a substrate, the positioning errors may result in overlay errors.

Figure 4A:
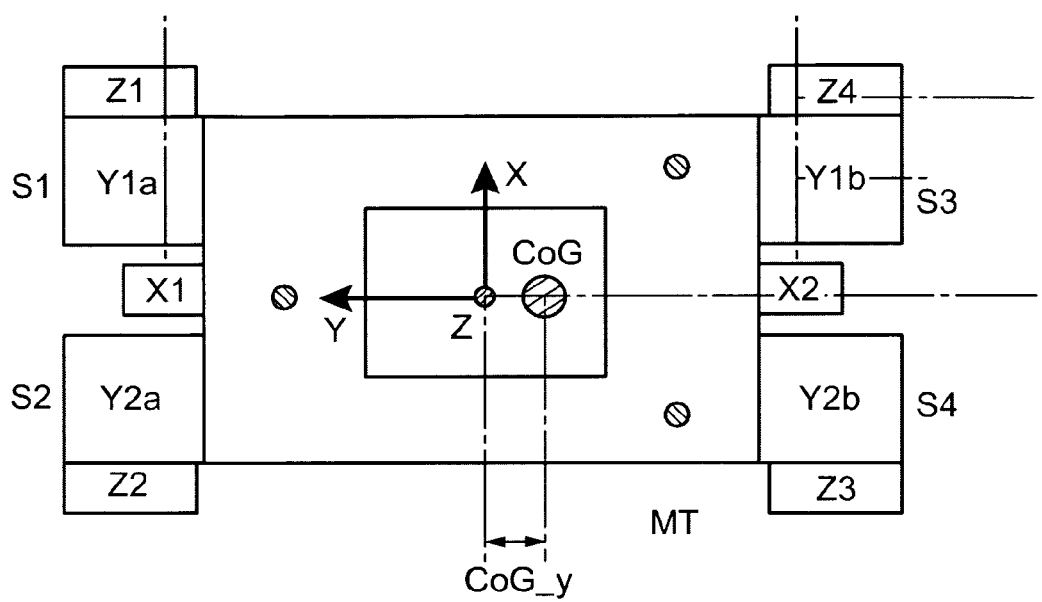
FIG. 4a depicts a schematic view of a second stage according to an embodiment of the invention.

FIG. 3b shows some possible chuck deformations:
A: linear deformation from using Y-actuators
B: diamond deformation from using X- and Y-actuators
C: trapezium deformation from using Y-actuators FIG. 4a schematically depicts a second stage according to an embodiment of the invention. Four actuators are provided to exert a force onto the patterning device support in the scanning Y-direction, these actuators being indicated by Y1a, Y1b, Y2a, Y2b. Also, two actuators X1, X2 are provided to exert a force on the patterning device support in the X-direction. Further, four actuators Z1, Z2, Z3 and Z4 are provided to exert a force on the patterning device support in a direction perpendicular to the plane of the drawing of FIG. 4a, namely the Z-direction. The depicted configuration is symmetrical with respect to the X-direction as well as the Y-direction. In the embodiment depicted in FIG. 4a, an improved dynamic behavior may be achieved, providing e.g. higher resonance frequencies and less position dependent dynamic behavior, which results in a higher bandwidth to be achieved. The four Y actuators (Y1a, Y1b, Y2a, Y2b) allow high accelerations in the Y-direction, i.e. the scanning direction, which enables a high throughput.

Applying an embodiment of the invention in such a configuration, one may connect the coils of actuators Y1a and Y1b in series and supply them by the same power supply and use a second power supply to power a series connection of the coils of actuators Y2a and Y2b. One may also connect all 4 coils of actuators Y1a, Y1b, Y2a, and Y2b in series and supply them from a single power supply.

Figure 4B:
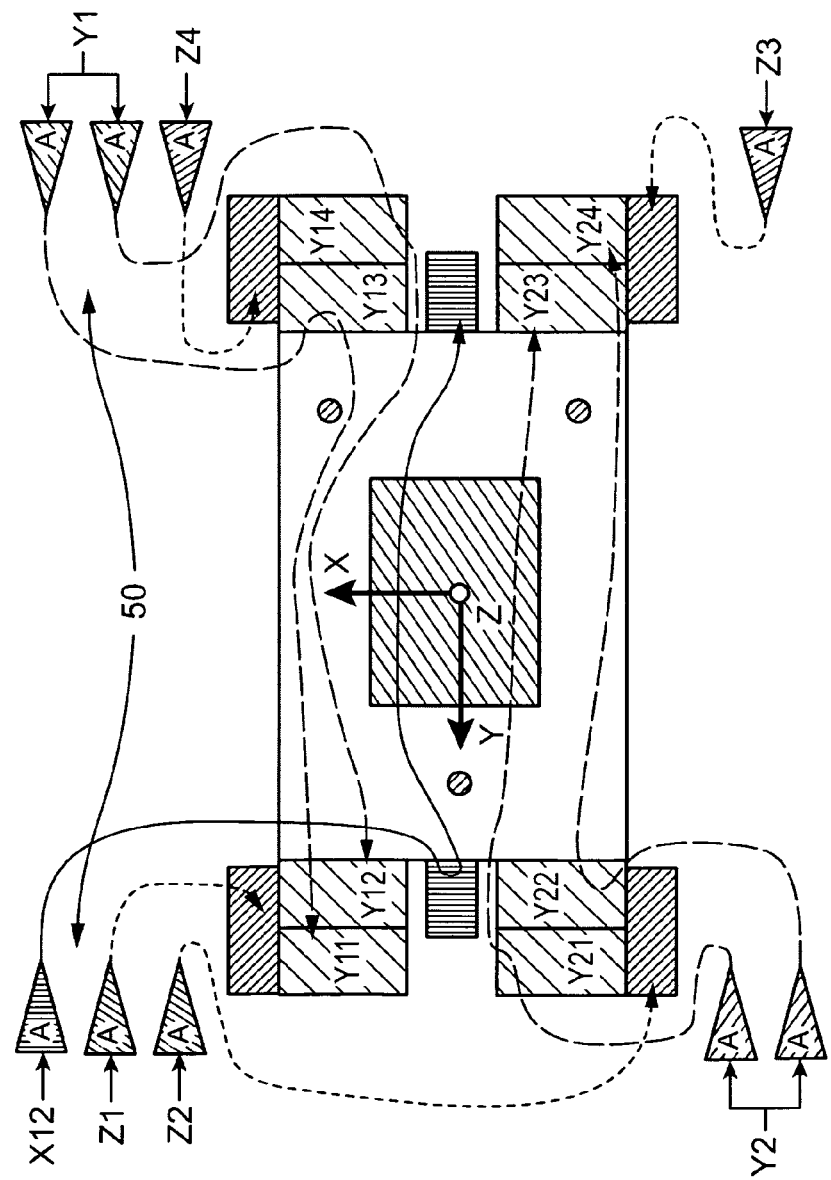
FIG. 4b depicts a schematic view of a third stage according to an embodiment of the invention.

In order to maintain more flexibility with respect to the choice of power supply, the coil associated with an actuator may be subdivided into multiple separate coils. Corresponding coils in each actuator can then be connected in series and supplied from the same power supply. FIG. 4b shows an example. As schematically shown, FIG. 4b shows the same stage layout as FIG. 4a apart from the coil arrangement of the different Y-actuators. As can be seen, the Y-actuator Y1a of FIG. 4a is subdivided into two actuators Y11 and Y12 to represent the subdividing of the actuator coil of Y1a. As indicated by the dashed lines, Y11 and Y13 are supplied by the same power supply, as are Y12 and Y14. As a result, the power supplied to Y11+Y13 will correspond to the power supplied to Y12+Y14, regardless of any difference between both power supplies used. Note that the power supplies are schematically indicated by the triangles 50.

As a consequence, the Y-actuators at the top left and right side of the patterning device support can be considered as one motor, just as the bottom left and right ones. By doing so, patterning device support deformation by over-actuation or amplifier offsets can be mitigated or avoided.

The patterning device support can be considered symmetrical around the Y-axis. As a result, the X-coordinate of the center of gravity (CoG) is symmetrical with respect to the Y-actuators. In general, the patterning device support will not be symmetrical with respect to the X-axis and therefore, the center of gravity X-coordinate will not be symmetrical with respect to the X-actuators. This deviation can be compensated by calibrating the so-called gain balancing matrix.

Desirably, the vertical center of the horizontal actuators lies substantially at the Z-coordinate of the center of gravity, thus the Y-forces will not produce any Rx torque in this situation.

The over-actuation can be taken into account by the following assumptions:

Trz is done by the Y-actuators to improve Rz dynamics. Actuators X1 and X2 get the same setpoint (Fx1=Fx2)

Fy is equally distributed to both Y-sides of the patterning device support to prevent patterning device support deformation (Fy_left=Fy_right for actuators Y1 and Y2).

Trx and Try are equally distributed to all Z-actuators to prevent patterning device deformation. Actuators Z1 and Z2 get the same setpoint from Rx torques, just as Z3 and Z4. Actuators Z1 and Z4 get the same setpoint from Ry torques, just as Z2 and Z3. This results in the following equations: Fz4−Fz1=Fz3−Fz2 (Trx) and Fz2−Fz1=Fz3−Fz4. These equations can be written as: −Fz1+Fz2−Fz3+Fz4=0

The above 4 constraints make up the difference between 10 actuators and 6 degrees of freedom.

In the actuator system part, only 1 X-motor (X1+X2), 2 Y-motors (Y1 & Y2) and 4 Z-motors is defined. The X- and Y-motors are split up in the actuator interface.

Figure 4C:
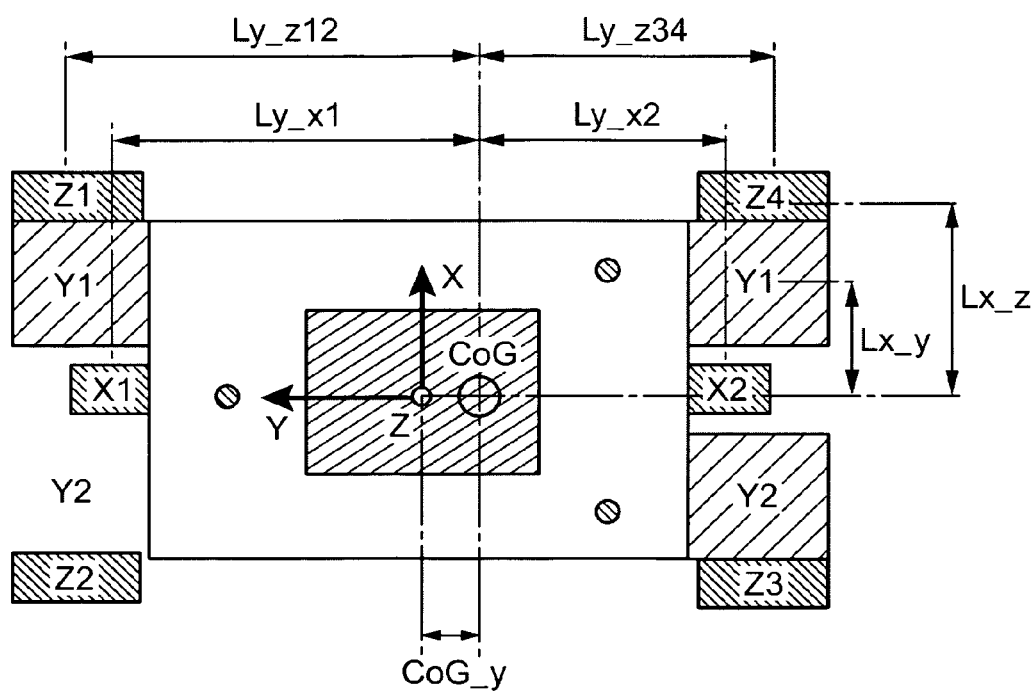
FIG. 4c schematically depicts the positional relationship between the center of gravity (CoG) and the various actuators of the second stage according to an embodiment of the invention.

The gain balancing matrix has 7 rows and 6 columns. The default gain balancing matrix is derived as follows (the symbols (corresponding to distances) used can be found in FIG. 4c)

$$\begin{pmatrix} X \\ Y \\ Rz \\ Z \\ Rx \\ Ry \\ 0 \end{pmatrix} = \begin{bmatrix} 2 & 0 & 0 & 0 & 0 & 0 & 0 \\ 0 & 2 & 2 & 0 & 0 & 0 & 0 \\ Ly_{X2}-Ly_{X1} & 2Lx_Y & -2Lx_Y & 0 & 0 & 0 & 0 \\ 0 & 0 & 0 & 1 & 1 & 1 & 1 \\ 0 & 0 & 0 & Ly_{Z12} & Ly_{Z12} & -Ly_{Z34} & -Ly_{Z34} \\ 0 & 0 & 0 & -Lx_Z & Lx_Z & Lx_Z & -Lx_Z \\ 0 & 0 & 0 & -1 & 1 & -1 & 1 \end{bmatrix} \cdot \begin{pmatrix} X12 \\ Y1 \\ Y2 \\ Z1 \\ Z2 \\ Z3 \\ Z4 \end{pmatrix}$$

More information regarding the use of the gain-balancing matrix can be found in U.S. patent application Ser. No. 11/712,555, filed Mar. 1, 2007, which is incorporated herein in its entirety by reference.

Examples of an embodiment of the invention have been discussed in relation to a patterning device support structure. As will be appreciated, the teaching herein may be applied to other supports, such as substrate table or other support.

What is claimed is:

1. A lithographic apparatus, comprising:
an illumination system configured to condition a radiation beam;
a patterning device support constructed to support a patterning device, the patterning device configured to impart the radiation beam with a pattern in its cross-section to form a patterned radiation beam;
a substrate support constructed to hold a substrate; and
a projection system configured to project the patterned radiation beam onto a target portion of the substrate;
wherein at least one of the supports is supported by a stage system comprising:
a stage,
a plurality of electromagnetic actuators, the actuators arranged to act on the stage and being over-determined in an actuator degree of freedom, and a first and a second electric power supply, wherein, in use, a current provided by the first electric power supply is supplied to a first coil associated with a first actuator of the plurality of actuators and to a first coil associated with a second actuator of the plurality of actuators, and a current provided by the second electric power supply is supplied to a second coil associated with the first actuator of the plurality of actuators and to a second coil associated with the second actuator of the plurality of actuators such that a total power applied to the first and second coils of the first actuator by the first and the second electric power supply substantially corresponds to a total power applied to the first and second coils of the second actuator by the first and the second electric power supply.

2. The apparatus of claim 1, wherein the first and second actuators are configured to move the stage in a substantially same direction.

3. The apparatus of claim 1, wherein the first and second actuators are arranged on different sides of the stage.

4. A stage system for a lithographic apparatus comprising:
a stage;
a first and a second electromagnetic actuators that are each configured to move the stage in a substantially same direction; and
a first and a second electric power supply,
wherein, in use, a current provided by the first electric power supply is supplied to a first coil associated with the first actuator and to a first coil associated with the second actuator and a current provided by the second electric power supply is supplied to a second coil associated with the first actuator and to a second coil associated with the second actuator such that a total power applied to the first and second coils of the first actuator by the first and the second electric power supply substantially corresponds to a total power applied to the first and second coils of the second actuator by the first and the second electric power supply.

5. The stage system of claim 4, wherein the first and second actuators are arranged on different sides of the stage.

* * * * *